US008970296B1

(12) United States Patent
Pratt

(10) Patent No.: US 8,970,296 B1
(45) Date of Patent: Mar. 3, 2015

(54) AMPLIFYING CIRCUIT WITH BYPASS MODE AND SERIES ISOLATION SWITCH

(71) Applicant: Guerrilla RF, LLC, Summerfield, NC (US)

(72) Inventor: Ryan Michael Pratt, Summerfield, NC (US)

(73) Assignee: Guerrilla RF, Inc., Greensboro, NC (US)

( * ) Notice: Subject to any disclaimer, the term of this patent is extended or adjusted under 35 U.S.C. 154(b) by 0 days.

(21) Appl. No.: 14/183,391

(22) Filed: Feb. 18, 2014

Related U.S. Application Data

(60) Provisional application No. 61/805,481, filed on Mar. 26, 2013.

(51) Int. Cl.
  *H03F 1/14* (2006.01)
  *H03F 1/00* (2006.01)
  *H03F 3/16* (2006.01)

(52) U.S. Cl.
  CPC ... *H03F 1/00* (2013.01); *H03F 3/16* (2013.01)
  USPC .......................................... 330/51; 330/302

(58) Field of Classification Search
  USPC ............................ 330/51, 310–311, 129, 151
  See application file for complete search history.

(56) References Cited

U.S. PATENT DOCUMENTS

| 5,661,434 | A * | 8/1997 | Brozovich et al. ............... 330/51 |
| 6,625,238 | B2 | 9/2003 | Wieck |
| 6,657,498 | B2 | 12/2003 | Park et al. |
| 6,882,226 | B2 | 4/2005 | Cho et al. |
| 6,930,546 | B2 | 8/2005 | Floyd |
| 7,079,825 | B2 | 7/2006 | Wieck |
| 7,679,452 | B2 | 3/2010 | Afonso Perez |
| 7,711,334 | B2 | 5/2010 | Sivasubramaniam |
| 7,894,780 | B2 | 2/2011 | Pan et al. |
| 7,898,325 | B2 * | 3/2011 | Hasan Abrar ................... 330/51 |

(Continued)

FOREIGN PATENT DOCUMENTS

WO        02/15397 A2     2/2002

OTHER PUBLICATIONS

Seong-Sik Myoung, et al., "Low Noise and High Linearity LNA based on InGaP/GaAs HBT for 5.3 GHz WLAN", 13th GAAS Symposium, 2005, pp. 89-92, Basic Research Fund of Yonsei University, Paris, France.

(Continued)

*Primary Examiner* — Hieu Nguyen
(74) *Attorney, Agent, or Firm* — NKK Patent Law, PLLC

(57) ABSTRACT

An amplifying circuit for receiving a signal in a wireless network includes an amplifier and two switches. The amplifier includes an isolation switch having a gate connected to a control signal for activating the isolation switch transistor in a bypass mode and a source/drain connected to the input for receiving the signal and the other source/drain connected to the gate of an amplifier transistor. The amplifier also includes a bypass transistor having a gate connected to a control signal for activating the bypass transistor in a bypass mode. The bypass switch is connected in parallel with the series combination of the isolation switch and amplifier between the input and output, enabling the received signal to bypass the amplifier. In the bypass mode, the isolation switch prevents RF energy from voltage modulating the gate of the amplifier transistor gate thus reducing undesirable distortion and harmonics from the amplifier.

19 Claims, 6 Drawing Sheets

(56) References Cited

U.S. PATENT DOCUMENTS

| | | | |
|---|---|---|---|
| 8,149,050 B2 * | 4/2012 | Cabanillas | 330/51 |
| 8,265,586 B2 | 9/2012 | Lee et al. | |
| 8,289,085 B2 | 10/2012 | Tajima et al. | |
| 8,442,465 B2 | 5/2013 | Leverich | |
| 8,564,371 B2 | 10/2013 | Trulls Fortuny et al. | |
| 2008/0185625 A1 | 8/2008 | Yim et al. | |
| 2014/0002190 A1 | 1/2014 | Marsan et al. | |

OTHER PUBLICATIONS

Sotoudeh Hamedi-Hagh, et al., "A Digitally Controlled Low Voltage Variable Gain Amplifier with Constant Return Loss", Cyber Journals: Multidisciplinary Journals in Science and Technology, Journal of Selected Areas in Microelectronics (JSAM), Sep. 2012, pp. 1-7, Sep. Edition 2012, Department of Electrical Engineering at San Jose State University, San Jose, California, USA.

* cited by examiner

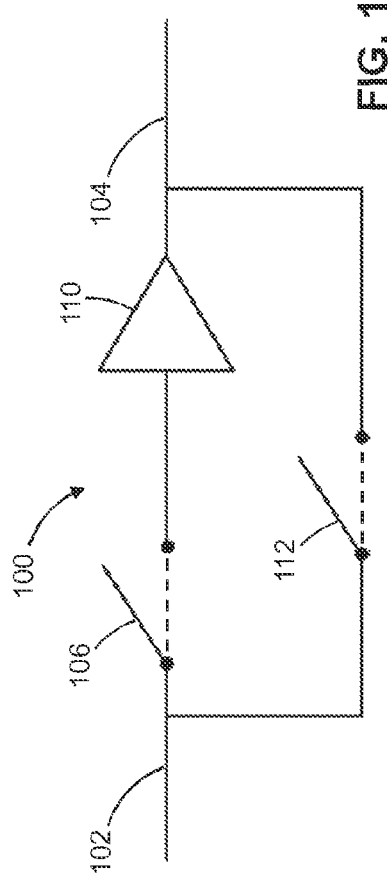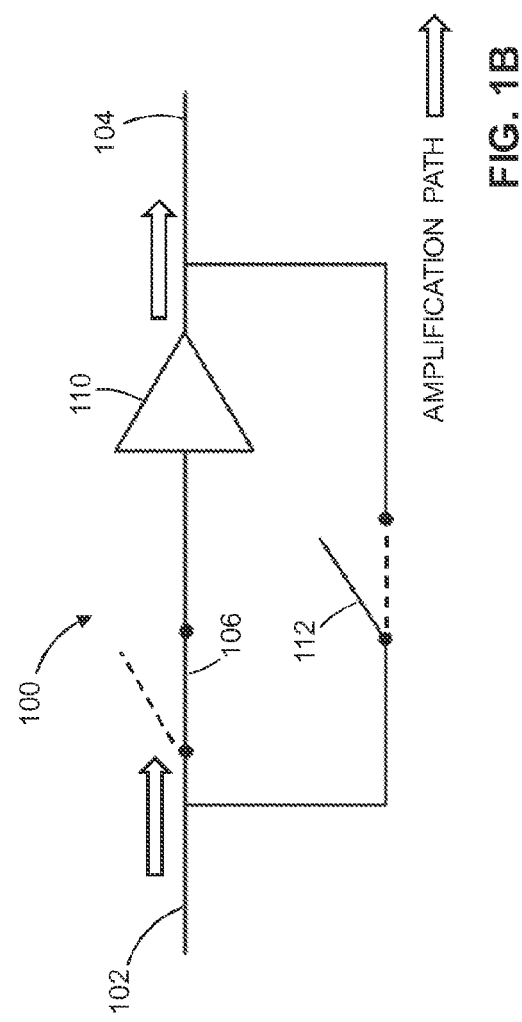

AMPLIFYING CIRCUIT WITH BYPASS MODE AND SERIES ISOLATION SWITCH

CROSS-REFERENCE TO RELATED APPLICATION

This application claims the benefit of priority of U.S. provisional patent application No. 61/805,481, titled "LNA with Bypass Mode Including Series Isolation Switch," filed on Mar. 26, 2013, which is incorporated herein in its entirety by this reference. This application is also being contemporaneously filed with U.S. utility application Ser. No. 14/183,439, the contents of which are incorporated herein in its entirety by this reference.

TECHNICAL FIELD

The present disclosure relates to signal amplification devices and methods. More particularly, the present disclosure relates to signal amplification devices and methods in which an amplifying path through a circuit can be bypassed.

BACKGROUND

Low Noise Amplifiers (LNA) are often used in wireless communications to amplify weak received signals. However, when a strong radio-frequency (RF) signal is being received, an LNA may become unnecessary and can cause unwanted distortion in a receiver. To solve this problem, an LNA is sometimes used with a bypass switch configuration. A bypass mode allows an LNA to be digitally shutdown and simultaneously a bypass switch turned on, allowing a strong signal to go around the amplifier.

When using a field-effect transistor (FET) based LNA with a bypass switch in bypass mode, the FET can begin to be turned on as the high RF signal strength begins to modulate the gate of the FET. This unintended FET behavior causes unwanted distortion to be generated at the input and output of the LNA, potentially causing receiver signal corruption. This is a common issue with many examples of amplification circuits having bypass modes.

Accordingly, there is a need for an improved circuit or switching mechanism or other component that can address these problems associated with conventional devices.

SUMMARY

This Summary is provided to introduce in a simplified form concepts that are further described in the following detailed descriptions. This Summary is not intended to identify key features or essential features of the claimed subject matter, nor is it to be construed as limiting the scope of the claimed subject matter.

In at least one embodiment, an amplifier circuit includes: a signal input point and a signal output point; a signal amplifying path from the signal input point to the signal output point, the signal amplifying path including a first switch in series with an amplifier; and a signal bypass path from the signal input point to the signal output point, the signal bypass path being electrically parallel to the signal amplifying path, the signal bypass path including a second switch.

In at least one example, the amplifier circuit further includes a control point. The first switch includes a first transistor having a first gate, a first source, and a first drain. The first gate is coupled to the control point, one of the first source and first drain is coupled to the signal input point and the other of the first source and first drain is coupled to the amplifier.

The second switch includes a second transistor having a second gate, a second source, and a second drain. The second gate is coupled to the control point, one of the second source and second drain is coupled to the signal input point, and the other of the second source and second drain is coupled to the signal output point.

In at least one example, the amplifier includes a third transistor having a third gate, a third source, and a third drain. The third gate is coupled to the first switch in the signal amplifying path, and one of the third source and third drain is coupled to the signal output point. The amplifier may further include a fourth transistor having a fourth gate, a fourth source, and a fourth drain. One of the fourth source and fourth drain is coupled to the third transistor and the other of the fourth source and fourth drain is coupled to the signal output point. The third transistor may coupled to the signal output point through the fourth transistor in a cascade amplifying configuration.

In at least one example, an inverter has an input coupled to the control point and an output coupled to the second switch. In at least one example, a shunting path branches to ground from the amplifying path between the first switch and the amplifier.

In at least one embodiment, an amplifier circuit includes: a signal input point; a control point; an isolation transistor including a gate, a source, and a drain; a bypass transistor including a gate, a source, and a drain; an amplifying transistor including a gate, a source, and a drain; a coupling capacitor; an inductor; and a voltage source. The isolation transistor gate is coupled to the control point. One of the source and drain of the isolation transistor is coupled to the signal input point and the other of the source and drain of the isolation transistor is coupled to the gate of the amplifying transistor through the coupling transistor. The bypass transistor gate is coupled to the control point. One of the source and drain of the bypass transistor is coupled to the signal input point and the other of the source and drain of the bypass transistor is coupled to one of the source and drain of the amplifying transistor. The other of the source and drain of the amplifying transistor is coupled to the voltage source through the inductor.

In at least one example, the bypass transistor is configured to bypass the isolation transistor and amplifying transistor when the bypass transistor is activated. The isolation transistor attenuates radio-frequency (RF) energy from reaching the gate of the amplifying transistor when the isolation transistor is de-activated.

In at least one example, a shunting transistor includes a gate, a source, and a drain. One of the source and drain of the shunting transistor is coupled to one of the source and drain of the isolation transistor. The other of the source and drain of the shunting transistor is coupled to ground in a shunting path.

In at least one example, an inverter has an input coupled to the control point and an output coupled to the gate of the shunting transistor. In at least one example, the output of the inverter is coupled to the gate of the bypass transistor such that the bypass transistor gate is coupled to the control point through the inverter.

In at least one example, a second amplifying transistor includes a gate, a source, and a drain. The source or drain of the amplifying transistor is coupled to an output point of the amplifier circuit through the second amplifying transistor in a cascade amplifying configuration.

In at least one embodiment, a method of propagating a signal includes: receiving a signal at a signal input point of a circuit, the circuit including the signal input point, a signal output point, a signal amplifying path from the signal input point to the signal output point, and a signal bypass path electrically parallel to the signal amplifying path from the signal input point to the signal output point, the signal amplifying path including a first switch and an amplifier in series with the first switch, the signal bypass path including a second switch; receiving a control signal; and configuring the circuit according to the control signal to assume one of three modes including a signal amplifying mode, a signal bypass mode, and a signal blocking mode. The signal is amplified according to the signal amplifying mode by propagating the signal along the signal amplifying path through the first switch, amplifying the signal through the amplifier, and propagating the amplified signal to the signal output point. The signal is propagated unamplified according to the signal bypass mode by propagating the signal along the signal bypass path through the second switch and to the signal output point. The signal is attenuated according to the signal blocking mode by configuring the first switch to attenuate the signal from propagating along the signal amplifying path and configuring the second switch to attenuate the signal from propagating along the signal bypass path.

In at least one example, the circuit is configured to assume the signal bypass mode, the first switch is configured to attenuate the signal from propagating along the signal amplifying path and shunt any attenuated signal propagated along the signal amplifying path to ground along a shunting path branching from the amplifying path upstream of the amplifier.

In at least one example, when the circuit is configured to assume the signal blocking mode, the first switch is configured to attenuate the signal from propagating along the signal amplifying path and shunt any attenuated signal propagated along the signal amplifying path to ground along a shunting path branching from the amplifying path upstream of the amplifier.

In at least one example, amplifying the signal through the amplifier includes: propagating the signal from the gate of a first transistor to a source or drain of the first transistor; receiving the signal propagated from the source or drain of the first transistor at one of a source and drain of a second transistor; and further propagating the signal from the other of the source and drain of the second transistor.

In at least one example, the method further includes: sending the control signal to one of the first switch and second switch; configuring said one of the first switch and second switch according to the control signal; inverting the control signal; sending the inverted control signal to the other of the first switch and second switch; and configuring said other of the first switch and second switch according to the inverted control signal.

In at least one example, the circuit is configured according to the control signal to assume an isolation mode, by which the bypass path is removed from electrical communication with the circuit.

BRIEF DESCRIPTION OF THE DRAWINGS

The previous summary and the following detailed descriptions are to be read in view of the drawings, which illustrate particular exemplary embodiments and features as briefly described below. The summary and detailed descriptions, however, are not limited to only those embodiments and features explicitly illustrated.

FIG. 1A is a circuit diagram representing an amplification circuit, according to at least one embodiment, set to an off mode.

FIG. 1B is a circuit diagram representing the amplification circuit of FIG. 1A, set to an on mode.

DETAILED DESCRIPTIONS

These descriptions are presented with sufficient details to provide an understanding of one or more particular embodiments of broader inventive subject matters. These descriptions expound upon and exemplify particular features of those particular embodiments without limiting the inventive subject matters to the explicitly described embodiments and features. Considerations in view of these descriptions will likely give rise to additional and similar embodiments and features without departing from the scope of the inventive subject matters. Although the term "step" may be expressly used or implied relating to features of processes or methods, no implication is made of any particular order or sequence among such expressed or implied steps unless an order or sequence is explicitly stated.

The circuit diagrams of the drawings should not necessarily be understood as pictorial representations of all circuits to which the drawings and these descriptions relate. Circuits pictorially different from the circuit diagrams as drawn may be electrically equivalent nonetheless such that the drawings and these descriptions relate to all such circuits. However, each drawing should nonetheless be understood as well to relate to any circuits that do pictorially resemble the drawings.

Figure 1C:
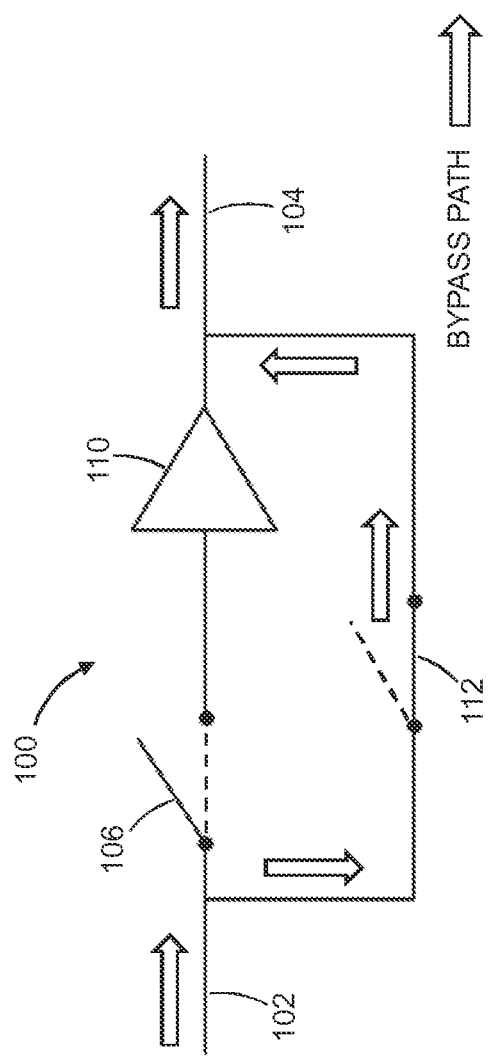
FIG. 1C is a circuit diagram representing the amplification circuit of FIG. 1A, set to a bypass mode.

FIGS. 1A-1C are circuit diagrams representing various modes of an amplification circuit 100, in which a signal amplification path and a signal bypass path are arranged in parallel relation between an input 102 and output 104 with respect to forward signal propagation. The signal amplification path includes, in order from the input 102 to the output 104, an isolation switch 106 in series with an amplifier 110. The signal bypass path includes, in order from the input 102 to the output 104, a bypass switch 112 in parallel electrical relation to the series combination of the isolation switch 106 and amplifier 110. The amplification circuit 100 in at least one embodiment is used in receive mode and is turned off during transmit mode. A TDD (Time Division Duplexing) system may allow only one of transmit and receive modes to be active at any given time, but not both simultaneously.

An off state of the amplification circuit 100 is represented in FIG. 1A, in which the isolation switch 106 and the bypass switch 112 are both open, attenuating or blocking signal propagation between the input 102 and output 104 in both the signal amplification path and the signal bypass path. In the off state, all devices are configured to draw minimal power and cause maximum signal attenuation between the input 102 and output 104. In at least one embodiment, the off state (FIG. 1A) of the amplification circuit 100 is maintained during the transmit mode but not in receive mode.

An on state of the amplification circuit 100 is represented in FIG. 1B, in which the isolation switch 106 is closed, providing a low impedance path from the input 102 of the circuit 100 to the input of the amplifier 110 along the signal amplification path. The amplifier 110 is turned on to amplify the incoming signal and send an amplified signal to the output 104. Isolation switch 106 is open such that the signal bypass path becomes a high impedance path in parallel with the signal amplification path. This ensures that there is only one viable path, the signal amplification path, from the input 102 to the output 104 for signal propagation, ensuring proper operation. In at least one embodiment, the on state (FIG. 1B) of the amplification circuit 100 is maintained when receiving a weak signal in receive mode, but not in transmit mode.

A bypass state of the amplification circuit 100 is represented in FIG. 1C, in which the bypass switch 112 is closed, providing a low impedance path for signal propagation to from the input 102 to the output 104 along the signal bypass path. The isolation switch 106 is open and the amplifier 110 is off, such that the signal amplification path becomes a high impedance path. This ensures that there is only one viable path, the signal bypass path, from the input 102 to the output 104 for signal propagation, ensuring proper operation. In at least one embodiment, the bypass state (FIG. 1C) of the amplification circuit 100 is maintained when receiving a strong signal in receive mode, but not in transmit mode.

Figure 2:
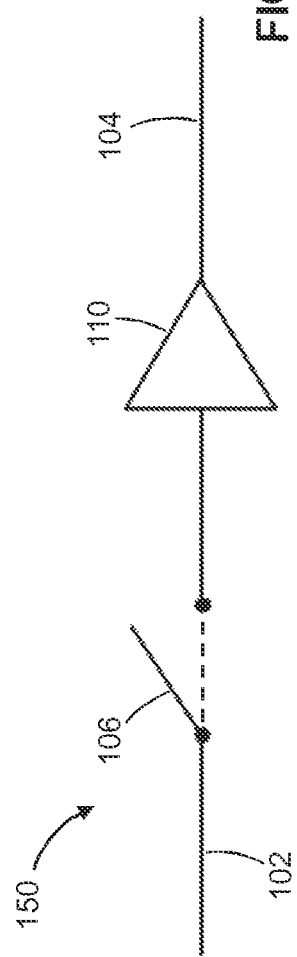
FIG. 2 is a circuit diagram representing an amplification circuit, according to at least one embodiment, set to an isolation mode.

FIG. 2 is a circuit diagram representing an amplification circuit 150, in which a signal amplification path includes, in order from the input 102 to the output 104, an isolation switch 106 in series with an amplifier 110. In FIG. 2, in comparison with FIGS. 1A-1C, there is no signal bypass path arranged in parallel relation with the signal amplification path. An isolation state of the amplification circuit 150 is represented in FIG. 2, in which the isolation switch 106 is open and the amplifier is off. Minimal power is drawn and maximum signal attenuation between the input 102 and output 104 occurs. Thus, the illustrated state of the amplification circuit 100 can be compared to the off state (FIG. 1A) of the amplification circuit 100. In at least one embodiment, the amplification circuit 150 in FIG. 2 is maintained in the isolation state as shown during transmit mode but not in receive mode. The isolation state of the amplification circuit 150 may be used in applications where strong receive signals are not likely or problematic.

Figure 3:
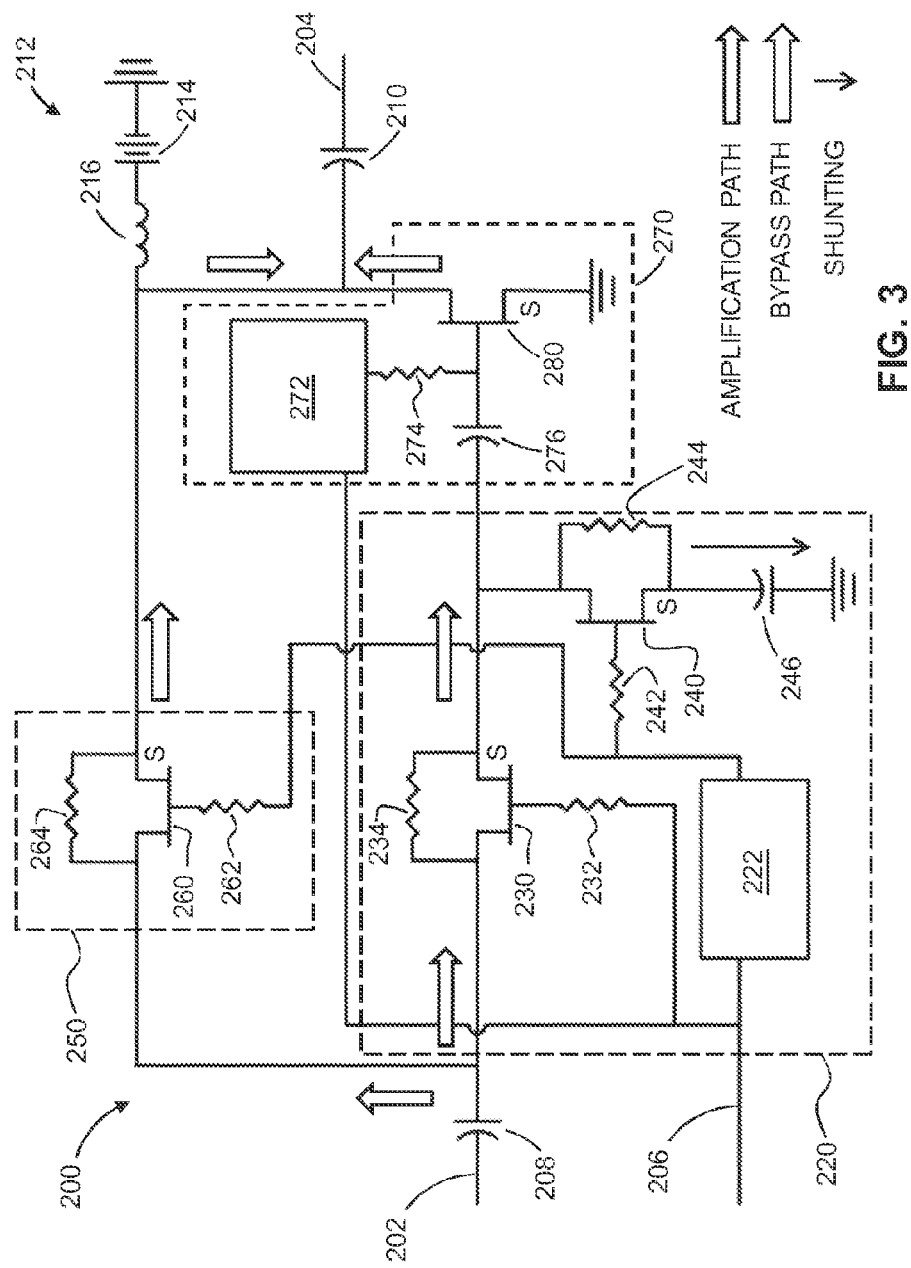
FIG. 3 is a circuit diagram representing an amplification circuit, according to at least one embodiment, having amplification, bypass, and shunting paths.

FIG. 3 is a circuit diagram representing various modes of an amplification circuit 200, in which a signal amplification path and a signal bypass path are arranged in parallel relation between an input 202 and output 204 with respect to forward signal propagation. A control line 206 is used to govern the state of the amplification circuit 200 between off, on, and bypass modes. An input-side capacitor 208 resides between the input 202 and downstream components of the circuit 200. Similarly, an output-side capacitor 210 resides between the output 204 and upstream components of the circuit 200. The amplification path and bypass path diverge downstream of the input-side capacitor 208 and converge upstream of the output-side capacitor 210.

The input 202, the output 204, the control line 206 are represented as lines in FIG. 3 but should be understood more broadly as connective terminals, conducting paths, metallic traces, or points of electrical contact where input signals, output signals, and control signals can enter or exit the circuit 200. This holds true for FIG. 3 and the other drawings as well.

A bias assembly 212, which includes a voltage source 214 and an inductor 216, biases the upstream side of the output-side capacitor 210 relative to ground. Thus, fluctuations at the output 204 represent signal propagation along either the amplification path or bypass path, which are not active simultaneously. The signal amplification path includes, in order from the input 202 to the output 204, an isolation switch 220 in series with an amplifier 270. The signal bypass path includes a parallel bypass switch 250 upstream of the bias assembly 212. The control line 206 branches to the amplifier 270 and the isolation switch 220. An inverter 222 receives the control line 206 and governs the bypass switch 250.

The isolation switch 220 includes a field-effect transistor (FET) 230 having a drain coupled to the signal input 202 via the input-side capacitor 208, and a source (S) connected to the upstream signal input side of the amplifier 270. The control line 206 is coupled to the gate of the FET 230 through a resistor 232 and governs the gate of the FET 230 via the resistor 232. A resistor 234 is connected in parallel relation to the drain and source (S) of the FET 230 defining a variable resistor for signal propagation toward the amplifier 270 at low impedance and signal attenuation at high impedance as governed by the control line 206.

The gate of a FET 240 is governed by the inverter 222 via a resistor 242. The inverter 222 has an input connected to the control line 206 and an output coupled to the gate of the FET 240 through the resistor 242. The FET 240 has a drain connected to the source (S) of the FET 230. The FET 240 has a source (S) coupled to ground through a capacitor 246 in a shunting path. A resistor 244 is connected in parallel relation to the drain and source (S) of the FET 240 defining a variable resistor along the shunting path. As governed by the inverter 222, the shunting path can permit signal energy, for example RF energy, to drain to ground for signal attenuation upstream of the amplifier 270. On the other hand, the shunting path can prevent such draining to preserve signal energy propagating along the amplification path.

The bypass switch 250 includes a field-effect transistor (FET) 260 having a drain connected to the input 202 and a source (S) upstream of the bias assembly 212 and output 204. The gate of a FET 260 is governed by the inverter 222 via a resistor 262. The input of the inverter 222 is connected to the control line 206 and the output of the inverter 222 is coupled to the gate of the FET 260 through the resistor 262. A resistor 264 is connected in parallel relation to the drain and source (S) of the FET 260 defining a variable resistor for signal propagation along the bypass path toward the output 204 at low impedance and signal attenuation along the bypass path at high impedance as governed by the inverter 222.

The amplifier 270 (FIG. 3) includes a bias circuit 272 coupled by direct connection to the control line 206. The bias circuit 272, via a resistor 274, biases the gate of a FET 280 as governed by the control line 206. The FET 280 has a source (S) connected to ground and a drain connected to the output 204 via the output-side capacitor 210 at the downstream convergence of the amplification and bypass paths. A capacitor 276 couples the source of the FET 230 of the isolation switch 220 to the gate of the FET 280 of the amplifier 270. Thus any steady state voltage level along the amplification path is filtered by the capacitor 276 such that the bias at the gate of the FET 280 is set by the bias circuit 272. Voltage fluctuation along the amplification path at the gate of the FET 280 represents forward signal propagation from the FET 230 across the capacitor 276 for amplification toward the output 204.

The amplification circuit 200 in at least one embodiment is used in receive mode and is turned off during transmit mode.

A TDD (Time Division Duplexing) system may allow only one of transmit and receive modes to be active at any given time, but not both simultaneously.

In an off state of the circuit 200 (FIG. 3), the illustrated FET devices are in their off states, wherein they are configured to draw minimal power and cause maximum signal attenuation between the input 202 and output 204. As such, the circuit 200 can be described as assuming a signal blocking mode in the off state. Specifically, FET 230 attenuates the incoming signal along the amplification path such that only a weakened signal makes it through. Next, FET 240 shunts this weakened signal to ground, preventing it from reaching the gate of the FET 280. FET 280 is turned off, providing further signal attenuation. In parallel, FET 260 greatly attenuates the incoming signal along the bypass path, also preventing it from reaching the output 204. In at least one embodiment, the off state of the amplification circuit 200 is maintained during transmit mode but not in receive mode.

In an on state of the circuit 200 (FIG. 3), the devices are configured to allow the amplifier 270 to amplify an incoming signal. As such, the circuit 200 can be described as assuming a signal amplifying mode in the on state. To facilitate this, FET 230 is turned on permitting signal propagation from the input 202 to the amplifier 270, and FET 240 is turned off, preventing signal energy attenuation through shunting upstream of the amplifier 270. This provides low impedance along the amplification path for signal propagation from the input 202 to the gate of the FET 280, which is turned on. Meanwhile, FET 260 is turned off, providing high impedance against signal propagation along the bypass path. This ensures proper operation by assuring that there is only one viable path for signal propagation, namely the amplification path from the input 206 to the output 204. In at least one embodiment, the on state of the amplification circuit 200 is maintained when receiving a weak signal in receive mode but not in transmit mode.

In a bypass state of the circuit 200 (FIG. 3), the devices are configured to allow bypass switch 250 to permit the incoming signal to propagate along the bypass path. As such, the circuit 200 can be described as assuming a signal bypass mode in the bypass state. To facilitate this, the FET 260 is turned on, closing the bypass switch 250 and providing low impedance for signal propagation along the bypass path from the input 202 to the output 204. Meanwhile, FET 230 is turned off, opening the isolation switch 220, and the amplifier 270 is turned off, presenting high impedance against signal propagation along the amplification path. Specifically, FET 230 attenuates the incoming signal and only a weakened signal makes it through. Next, FET 240 shunts the weakened signal to ground, preventing it from reaching the gate of FET 280. FET 280 is turned off, creating a high impedance at the output node and at the interface between the isolation switch 220 and amplifier 270. This ensures that there is only one viable path from the input 202 to the output 204 for signal propagation, namely the bypass path, ensuring proper operation. In at least one embodiment, the bypass state of the amplification circuit 200 is maintained when receiving a strong signal in receive mode but not in transmit mode.

Figure 4:
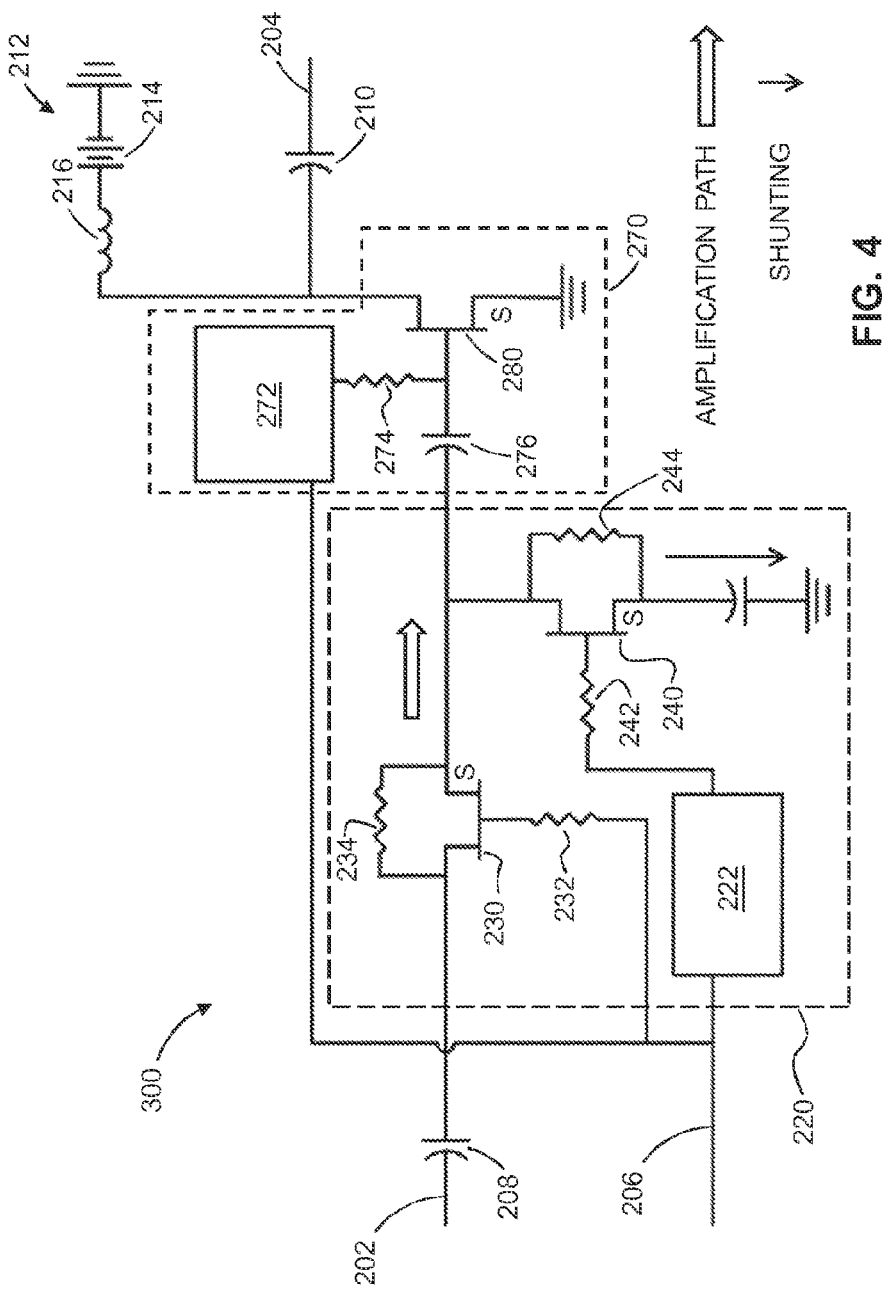
FIG. 4 is a circuit diagram representing an amplification circuit, according to at least one embodiment, having amplification and shunting paths.

FIG. 4 is a circuit diagram representing an amplification circuit 300, having many components in common with the amplification circuit 200 of FIG. 3, and similar arrangement. The difference between FIG. 4 and FIG. 3 is that the circuit 300 (FIG. 4) does not have a signal bypass switch 250 (FIG. 3) or bypass path thereof. Nonetheless, the components illustrated in FIG. 4 having the same reference numbers and appearances as components in FIG. 3 are adequately described already with reference to FIG. 3.

In an isolation state of the circuit 300 (FIG. 4), as in the off state of the circuit 200 (FIG. 3), the illustrated FET devices are in their off states, wherein they are configured to draw minimal power and cause maximum signal attenuation between the input 202 and output 204. Specifically, FET 230 attenuates the incoming signal along the amplification path such that only a weakened signal makes it through. Next, FET 240 shunts this weakened signal to ground, preventing it from reaching the gate of the FET 280. FET 280 is turned off, providing further signal attenuation. In at least one embodiment, the isolation state of the amplification circuit 300 is maintained during transmit mode but not in receive mode. The isolation state may be used in applications where strong receive signals are not likely or problematic.

Figure 5:
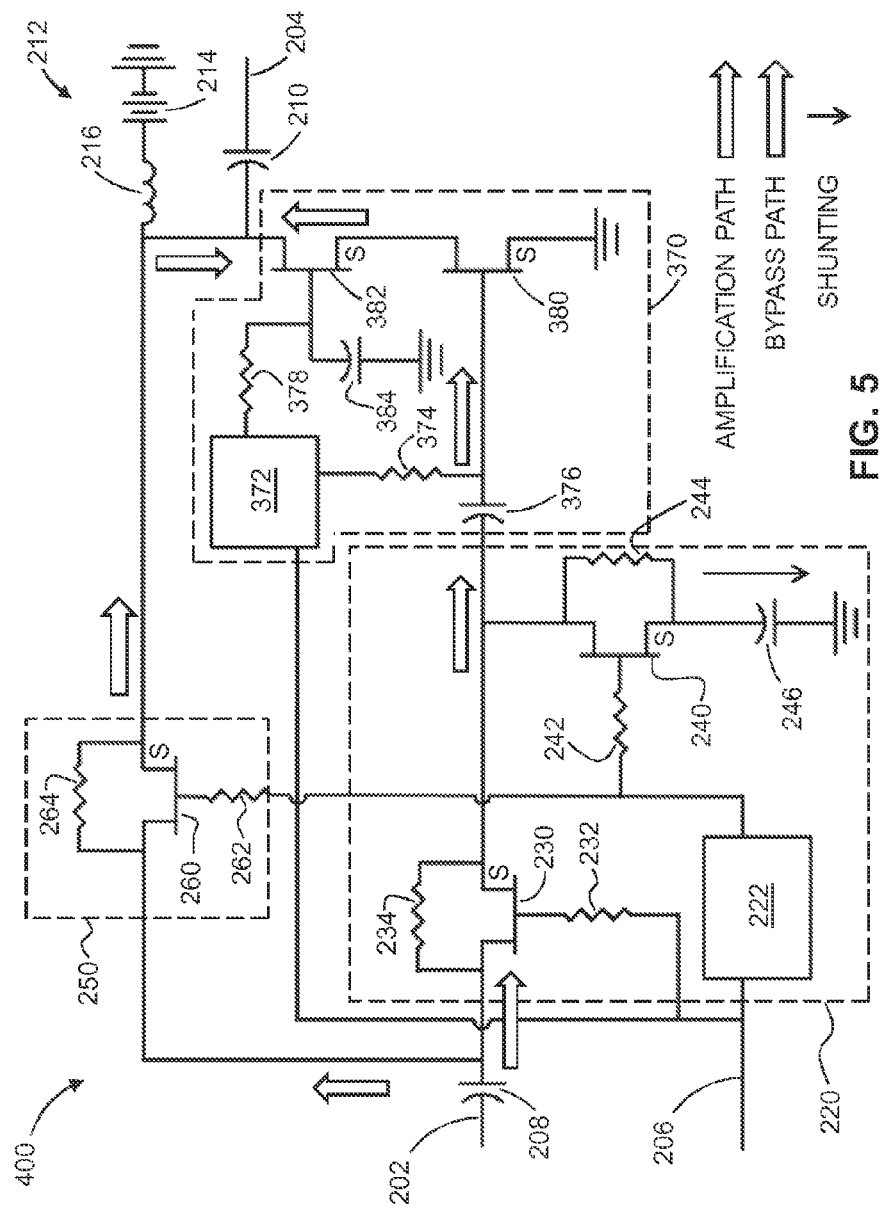
FIG. 5 is a circuit diagram representing an amplification circuit having a cascade amplifier configuration, according to at least one embodiment, and having amplification, bypass, and shunting paths.

FIG. 5 is a circuit diagram representing an amplification circuit 400, having many components in common with the amplification circuit 200 of FIG. 3, and similar arrangement. The difference between the two drawings is that an amplifier 370 is shown in FIG. 5 in lieu of the amplifier 270 shown in FIG. 3. In FIG. 5, the amplifier 370 has first FET 380 and a second FET 382 in a cascade arrangement. Nonetheless, the components illustrated in FIG. 4 having the same reference numbers and appearances as components in FIG. 3 are adequately described already with reference to FIG. 3.

The amplifier 370 includes a bias circuit 372 connected to the control line 206. The bias circuit 372, via a resistor 374, biases the gate of a first cascade FET 380 as governed by the control line 206. The FET 380 has a source (S) connected to ground and a drain connected to the source (S) of a second cascade FET 382. The second FET 382 has a drain connected to the output 204 via the output-side capacitor 210 at the downstream convergence of the amplification and bypass paths. A capacitor 376 resides electrically between the source of the FET 230 of the isolation switch 220 and the gate of the first FET 380 of the amplifier 370. Thus any steady state voltage level along the amplification path is filtered by the capacitor 376 such that the bias at the gate of the first FET 380 is set by the bias circuit 372. Voltage fluctuation along the amplification path at the gate of the first FET 380 represents forward signal propagation from the FET 230 across the capacitor 376 for amplification toward the output 204. The bias circuit 372, via a resistor 378, biases the gate of a second FET 382 as governed by the control line 206. The gate of a second FET 382 is also connected to ground via a capacitor 384. The first FET 380 and second FET 382 together compose a cascade amplifier configuration.

The amplification circuit 400 in at least one embodiment is used in receive mode and is turned off during transmit mode. A TDD (Time Division Duplexing) system may allow only one of transmit and receive modes to be active at any given time, but not both simultaneously.

In an off state of the circuit 400 (FIG. 5), the illustrated FET devices are in their off states, wherein they are configured to draw minimal power and cause maximum signal attenuation between the input 202 and output 204. As such, the circuit 400 can be described as assuming a signal blocking mode in the off state. Specifically, FET 230 attenuates the incoming signal along the amplification path such that only a weakened signal makes it through. Next, FET 240 shunts this weakened signal to ground, preventing it from reaching the gate of the FET 380. The FET 280 and FET 382 are turned off, providing further signal attenuation. In parallel, FET 260 greatly attenuates the incoming signal along the bypass path, also preventing it from reaching the output 204. In at least one embodiment, the off state of the amplification circuit 200 is maintained during transmit mode but not in receive mode.

In an on state of the circuit 400 (FIG. 5), the devices are configured to allow the amplifier 370 to amplify an incoming signal. As such, the circuit 400 can be described as assuming a signal amplifying mode in the on state. To facilitate this, FET 230 is turned on permitting signal propagation from the input 202 to the amplifier 370, and FET 240 is turned off, preventing signal energy attenuation by shunting upstream of the amplifier 370. This provides low impedance along the amplification path for signal propagation from the input 202 to the gate of the first FET 380 and forward to the second FET 382, which are turned on. The signal is amplified upon reaching the gate of first cascade FET 380 and further amplified upon reaching the source of second cascade FET 382. Meanwhile, FET 260 is turned off, providing high impedance against signal propagation along the bypass path. This ensures proper operation by assuring that there is only one viable path for signal propagation, namely the amplification path from the input 206 to the output 204. In at least one embodiment, the on state of the amplification circuit 200 is maintained when receiving a weak signal in receive mode but not in transmit mode.

In a bypass state of the circuit 400 (FIG. 5), the devices are configured to allow bypass switch 250 to permit the incoming signal to propagate along the bypass path. As such, the circuit 400 can be described as assuming a signal bypass mode in the bypass state. To facilitate this, the FET 260 is turned on, closing the bypass switch 250 and providing low impedance for signal propagation along the bypass path from the input 202 to the output 204. Meanwhile, FET 230 is turned off, opening the isolation switch 220, and the amplifier 370 is turned off, presenting high impedance against signal propagation along the amplification path. Specifically, FET 230 attenuates the incoming signal and only a weakened signal makes it through. Next, FET 240 shunts the weakened signal to ground, preventing it from reaching the gate of FET 380. First and second cascade FETs 380 and 382 are turned off, presenting high impedance against signal propagation across amplifier 370. This ensures that there is only one viable path from the input 202 to the output 204 for signal propagation, namely the bypass path, ensuring proper operation. In at least one embodiment, the bypass state of the amplification circuit 200 is maintained when receiving a strong signal in receive mode but not in transmit mode.

Figure 6:
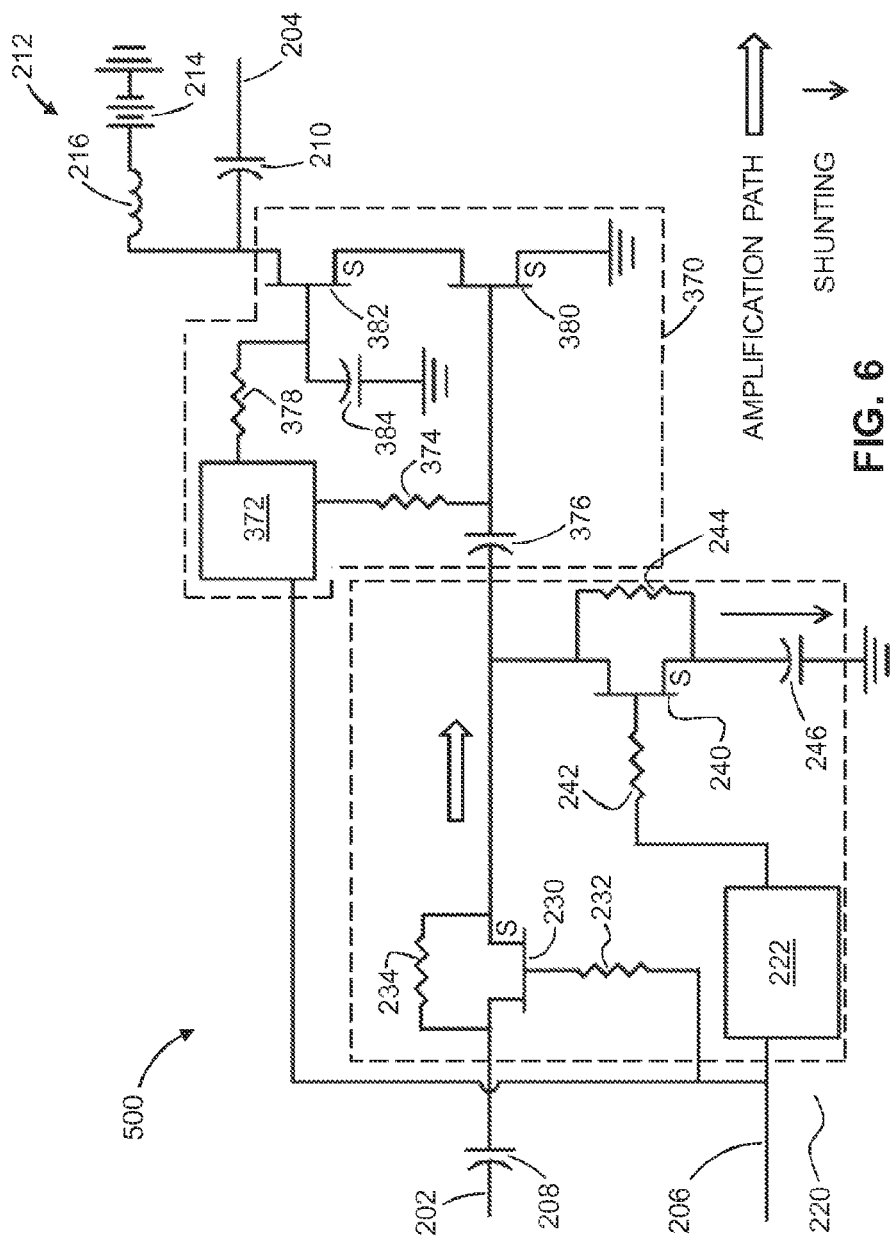
FIG. 6 is a circuit diagram representing an amplification circuit having a cascade amplifier configuration, according to at least one embodiment, and having amplification and shunting paths.

FIG. 6 is a circuit diagram representing an amplification circuit 500, having many components in common with the amplification circuit 300 of FIG. 4, and similar arrangement. Neither the circuit 300 in FIG. 4 nor the circuit 500 in FIG. 6 have a signal bypass switch 250 (FIG. 3) or bypass path thereof. The difference between the two drawings (FIGS. 4 and 6) is that the amplifier 370 is shown in FIG. 6 in lieu of the amplifier 270 shown in FIG. 4. In FIG. 6, the amplifier 370 has first FET 380 and a second FET 382 in a cascade arrangement. Nonetheless, the components illustrated in FIG. 6 having the same reference numbers and appearances as components in FIG. 4 are adequately described already with reference to FIGS. 3 and 4.

In an isolation state of the circuit 500 (FIG. 6), as in the off state of the circuit 400 (FIG. 5), the illustrated FET devices are in their off states, wherein they are configured to draw minimal power and cause maximum signal attenuation between the input 202 and output 204. Specifically, FET 230 attenuates the incoming signal along the amplification path such that only a weakened signal makes it through. Next, FET 240 shunts this weakened signal to ground, preventing it from reaching the gate of the first cascade FET 380. Cascade FETs 380 and 382 are turned off, providing further signal attenuation. In at least one embodiment, the isolation state of the amplification circuit 500 is maintained during transmit mode but not in receive mode. The isolation state may be used in applications where strong receive signals are not likely or problematic.

Particular embodiments and features have been described with reference to the drawings. It is to be understood that these descriptions are not limited to any single embodiment or any particular set of features, and that similar embodiments and features may arise or modifications and additions may be made without departing from the scope of these descriptions and the spirit of the appended claims.

What is claimed is:

1. An amplifier circuit comprising:
   a signal input point and a signal output point;
   a signal amplifying path from the signal input point to the signal output point, the signal amplifying path including a first switch in series with an amplifier and a shunting switch for providing a path branching to ground from the amplifying path between the first switch and the amplifier; and
   a signal bypass path from the signal input point to the signal output point, the signal bypass path being electrically parallel to the signal amplifying path, the signal bypass path including a second switch.

2. An amplifier circuit according to claim 1, further comprising a control point, wherein:
   the first switch includes a first transistor having a first gate, a first source, and a first drain, the first gate coupled to the control point, one of the first source and first drain coupled to the signal input point and the other of the first source and first drain coupled to the amplifier; and
   the second switch includes a second transistor having a second gate, a second source, and a second drain, the second gate coupled to the control point, one of the second source and second drain coupled to the signal input point and the other of the second source and second drain coupled to the signal output point.

3. An amplifier circuit according to claim 2, wherein the amplifier includes a third transistor having a third gate, a third source, and a third drain, the third gate coupled to the first switch in the signal amplifying path, and one of the third source and third drain coupled to the signal output point.

4. An amplifier circuit according to claim 3, wherein the amplifier further includes a fourth transistor having a fourth gate, a fourth source, and a fourth drain, with one of the fourth source and fourth drain coupled to the third transistor and the other of the fourth source and fourth drain coupled to the signal output point.

5. An amplifier circuit according to claim 4, wherein the third transistor is coupled to the signal output point through the fourth transistor in a cascade amplifying configuration.

6. An amplifier circuit according to claim 2, further comprising an inverter having an input coupled to the control point and an output coupled to the second switch.

7. An amplifier circuit according to claim 2, wherein the shunting switch comprises a shunting transistor having a source, a drain, and a gate, the gate coupled to the control point, one of the source and drain coupled to the amplifying path, and the other of the source and drain coupled ground.

8. An amplifier circuit according to claim 1, further comprising an inverter having an input coupled to the control point and an output coupled to the gate of the shunting transistor.

9. An amplifier circuit according to claim 8, wherein the output of the inverter is coupled to the gate of the bypass transistor such that the bypass transistor gate is coupled to the control point through the inverter.

10. An amplifier circuit comprising:
a signal input point;
a control point;
an isolation transistor including a gate, a source, and a drain;
a bypass transistor including a gate, a source, and a drain;
an amplifying transistor including a gate, a source, and a drain;
a shunting transistor including a gate, a source, and a drain;
a coupling capacitor;
an inductor; and
a voltage source,
wherein:
the isolation transistor gate is coupled to the control point;
one of the source and drain of the isolation transistor is coupled to the signal input point and the other of the source and drain of the isolation transistor is coupled to an amplifying path that is coupled to the gate of the amplifying transistor through the coupling capacitor;
one of the source and drain of the shunting transistor is coupled to the amplifying path and the other of the source and drain of the shunting transistor is coupled to ground;
the bypass transistor gate is coupled to the control point;
one of the source and drain of the bypass transistor is coupled to the signal input point and the other of the source and drain of the bypass transistor is coupled to one of the source and drain of the amplifying transistor, to which is also coupled the voltage source through the inductor; and
the other of the source and drain of the amplifying transistor is coupled to ground.

11. An amplifier circuit according to claim 10, wherein the bypass transistor is configured to bypass the isolation transistor and amplifying transistor when the bypass transistor is activated.

12. An amplifier circuit according to claim 11, wherein the isolation transistor attenuates radio-frequency (RF) energy from reaching the gate of the amplifying transistor when the isolation transistor is de-activated.

13. An amplifier circuit according to claim 10, further comprising a second amplifying transistor including a gate, a source, and a drain, wherein:
said other of the source and drain of the amplifying transistor is coupled to an output point of the amplifier circuit through the second amplifying transistor in a cascade amplifying configuration.

14. A method of propagating a signal comprising:
receiving a signal at a signal input point of a circuit, the circuit including the signal input point, a signal output point, a signal amplifying path from the signal input point to the signal output point, and a signal bypass path electrically parallel to the signal amplifying path from the signal input point to the signal output point, the signal amplifying path including a first switch, an amplifier in series with the first switch, and a shunting switch between the first switch and the amplifier for providing a shunting path from the amplifying path to ground, the signal bypass path including a second switch;
receiving a control signal; and
configuring the circuit according to the control signal to assume one of three modes including a signal amplifying mode, a signal bypass mode, and a signal blocking mode, by which the signal is:
amplified according to the signal amplifying mode by propagating the signal along the signal amplifying path through the first switch, amplifying the signal through the amplifier, and propagating the amplified signal to the signal output point;
propagated unamplified according to the signal bypass mode by propagating the signal along the signal bypass path through the second switch and to the signal output point; or
attenuated according to the signal blocking mode by configuring the first switch to attenuate the signal from propagating along the signal amplifying path and configuring the second switch to attenuate the signal from propagating along the signal bypass path.

15. A method according to claim 14, wherein when the circuit is configured to assume the signal bypass mode, the first switch is configured to attenuate the signal from propagating along the signal amplifying path and shunt any attenuated signal propagated along the signal amplifying path to ground along a shunting path branching from the amplifying path upstream of the amplifier.

16. A method according to claim 14, wherein when the circuit is configured to assume the signal blocking mode, the first switch is configured to attenuate the signal from propagating along the signal amplifying path and shunt any attenuated signal propagated along the signal amplifying path to ground along a shunting path branching from the amplifying path upstream of the amplifier.

17. A method according to claim 14, wherein amplifying the signal through the amplifier comprises:
propagating the signal from the gate of a first transistor to a source or drain of the first transistor;
receiving the signal propagated from the source or drain of the first transistor at one of a source and drain of a second transistor; and
further propagating the signal from the other of the source and drain of the second transistor.

18. A method according to claim 14, further comprising:
sending the control signal to one of the first switch and second switch;
configuring said one of the first switch and second switch according to the control signal;
inverting the control signal;
sending the inverted control signal to the other of the first switch and second switch; and
configuring said other of the first switch and second switch according to the inverted control signal.

19. A method according to claim 14, further comprising configuring the circuit according to the control signal to assume an isolation mode, by which the bypass path is removed from electrical communication with the circuit.

* * * * *